United States Patent [19]

Bushman

[11] Patent Number: 4,554,238

[45] Date of Patent: Nov. 19, 1985

[54] SPECTRALLY-SENSITIZED IMAGING SYSTEM

[75] Inventor: Stanley C. Bushman, Minneapolis, Minn.

[73] Assignee: Minnesota Mining and Manufacturing Company, St. Paul, Minn.

[21] Appl. No.: 591,419

[22] Filed: Mar. 20, 1984

[51] Int. Cl.$^4$ ................................................. G03C 1/90
[52] U.S. Cl. .................................. 430/258; 430/259; 430/257; 430/270
[58] Field of Search ................ 430/257, 258, 259, 270

[56] References Cited

U.S. PATENT DOCUMENTS

| | | | |
|---|---|---|---|
| 3,729,313 | 4/1973 | Smith | 96/27 |
| 3,741,769 | 6/1973 | Smith | 96/35.1 |
| 3,808,006 | 4/1974 | Smith | 96/88 |
| 4,069,054 | 1/1978 | Smith | 96/115 |
| 4,075,019 | 2/1978 | DoMinh | 430/151 |
| 4,250,053 | 2/1981 | Smith | 252/426 |
| 4,343,893 | 8/1982 | Donald et al. | 430/401 |
| 4,369,244 | 1/1983 | Eian et al. | 430/257 |

OTHER PUBLICATIONS

Amit et al., "Photosensitive Protecting Groups", Israel J. of Chem., 12 (1-2) 103 (1974).
Pillai, V. N. R., "Photoremovable Protecting Groups in Organic Synthesis", Synthesis, 1-26, Jan. 1980.

Primary Examiner—Won H. Louie
Attorney, Agent, or Firm—Donald M. Sell; James A. Smith; Lorraine R. Sherman

[57] ABSTRACT

The present invention provides a photosensitive element which comprises a substrate bearing on at least one surface thereof at least one photosensitive layer comprising a film forming polymer, a surfactant acid masked with a photolabile blocking group, and at least one spectral sensitizing compound conferring sensitivity within the wavelength range of 300 to 900 nm, i.e., the near UV (300 nm to 400 nm), the visible range (400 nm to 750 nm), and even into the near infrared region of the spectrum (750 to 900 nm). The composition can exhibit an increase in surface activity on irradiation with light in the wavelength range of 300 to 900 nm.

In another aspect, a peel-apart imaging article and process therefor is provided having photosensitivity within the wavelength region covering the near UV, visible, and near IR, yet having good stability of the unexposed material.

26 Claims, 3 Drawing Figures

SPECTRALLY-SENSITIZED IMAGING SYSTEM

FIELD OF THE INVENTION

The present invention relates to imaging materials and a process for their use, the materials comprising photolabile blocked surfactants which have photosensitivity in the near ultraviolet, visible region, and the near infrared region of the spectrum. A photosensitive layer and article are provided which are useful in printing plates, projection transparencies, and high resolution recording films. In another aspect, a peel-apart imaging article is provided for use in any application such as line image masters or printed circuits where high contrast, high density, and high resolution are required.

BACKGROUND ART

Photosensitive elements suitable for use in printing plates and information recording films are well known and are the subject of a great many publications and patents. Due to the increasing cost of silver, efforts have been made to displace silver halide as the photosensitive material in photosensitive elements with more or less success. Many of these non-silver containing photosensitive elements have utilized compositions containing moieties which polymerize on exposure to suitable radiation to yield a polymer in exposed areas of the element.

In recent years photosensitive elements using photolabile blocked surfactants have been developed. Such surfactants are compounds characterized by a hydrophobic group and at least one polar hydrophilic group, the polar group(s) being masked by a covalently bonded labile masking group. Because of the photolabile mask, the masked surfactant has substantially reduced surfactant activity as compared to the same surfactant in the unmasked state and, on exposure to suitable radiation, the mask is removed, substantially restoring the surfactant to its original surface activity.

U.S. Pat. No. 4,369,244 and copending patent application U.S. Ser. No. 177,288, filed Aug. 11, 1980, U.S. Pat. No. 4,478,967 disclose photosensitive imaging materials and a peel-apart imaging system based upon surfactant compounds whose surfactant activity is blocked by masking groups which are photolabile. On response to suitable radiation the surfactant is released and causes a change in adhesion of the layer in which it is situated relative to an adjacent layer (normally an opaque frangible layer). Peel-apart development can give a visible image. The radiation which may be used is determined by the absorption of the masking group and this may be modified to some extent by substituents on those groups. Thus the o-nitrobenzyl group absorbs at about 250 nm whereas the dimethoxy benzyl group absorbs at about 350 nm. The latter however is a less stable masking group than the former. Such photolabile masked systems are limited in their spectral sensitivity to the ultra violet or extreme blue regions of the spectrum. Attempts to modify the benzyl masking groups in U.S. Pat. No. 4,369,244 to give longer wavelength sensitivity by substituting the benzene ring with, for example, methoxy groups as in Formula I

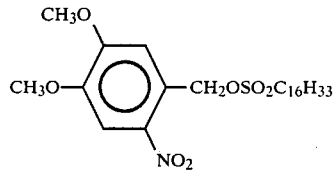

have resulted in much lower stability (i.e., poor shelf life) of the photolabile groups.

Masking (protecting) groups which are photolabile are discussed in detail in Amit et al., "Photosensitive Protecting Groups", Israel J. of Chem. 12 (1–2) 103 (1974) and V.N.R. Pillai, "Photoremovable Protecting Groups in Organic Synthesis", Synthesis, 1–26, January 1980. All the groups discussed are activated by radiation in the wavelength range of 200–400 nm. Although choice of the substituents on the groups determines the absorption peak in this range no mention is made of separate spectral sensitizing compounds being used.

Spectral sensitization of silver-containing photographic materials may be accomplished by incorporating certain organic dyes (sensitizer compounds) in the photosensitive layer. U.S. Pat. Nos. 3,729,313; 3,741,769; 3,808,006; 4,069,054; and 4,250,053 disclose photopolymerized or photoinitiated systems which are sensitized to radiation of longer wavelength than near UV by the addition of sensitizer compounds.

U.S. Pat. No. 4,343,893 discloses masked photographic developer compounds where the developer moiety is released by electron transfer from an alkali to the masking moiety without the absorption of radiation.

SUMMARY OF THE INVENTION

Spectral sensitization, the process of expanding the wavelength sensitivity of silver-containing photosensitive material, is known in the art. The intrinsic absorption and, therefore, the intrinsic photographic sensitivity of non-silver systems is, in many cases, restricted to wavelengths of less than 420 nm. For example, typical photosensitive groups and their upper wavelength sensitivity are as follows: diazo (450 nm), sulfonium (350 nm), iodonium (300 nm), and o-nitrobenzyl (400 nm). Extension of photosensitivity into the regions of the visible spectrum beyond 420 nm is necessary for optimum effective light sensitivity. If non-silver photographic materials can be sensitized to absorb throughout the visible spectrum and beyond, a wide range of commercially available light sources, including incandescent light, can be utilized.

Briefly, the present invention provides a photosensitive layer comprising a blend of:

(a) a light-transmissive film-forming polymeric material, (b) at least one photolabile blocked surfactant capable upon exposure to at least one wavelength of near UV, visible, or near IR radiation in the wavelength range 300 to 900 nm of releasing a detectable amount of surfactant in the exposed areas, and (c) at least one spectral sensitizing compound capable of conferring sensitivity to said surfactant to radiation within the wavelength range 300 to 900 nm i.e., the near UV (300 nm to 400 nm), the visible range (400 nm to 750 nm), and even into the near infrared region of the spectrum (750 to 900 nm). The layer can exhibit an increase in surface activity on irradiation with light in the wavelength range of 300 to 900 nm.

In another aspect, a photosensitive article is provided, the article comprising a support bearing on at least one surface the above-described photosensitive layer.

In yet another aspect, a peel-apart imaging article and process therefor is provided having photosensitivity within the wavelength region covering the near UV, visible, and near IR, yet having good stability of the unexposed material.

A particularly desirable photosensitive element comprises at least one frangible, light-opaque layer adhered to one surface of a photosensitive organic polymeric layer. Upon exposure to suitable radiation the polymeric layer changes its surface activity characteristics by the removal of a photolabile mask from a masked surfactant in the polymeric layer. The photo-sensitive organic polymeric layer comprises an organic film-forming polymer, a photolabile blocked surfactant, and at least one spectral sensitizing compound.

An article with both a frangible layer and a photosensitive layer may have a support layer for the photosensitive layer and/or the frangible layer. It also may be combined with a strippably adherent layer which adheres to the frangible layer or to the photosensitive layer. If the strippably adherent layer is adjacent the frangible layer it has a degree of adherence intermediate between the degree of adherence of the frangible layer to the exposed and to the unexposed photosensitive layer. If the strippably adherent layer is adjacent to the photosensitive layer it has a degree of adherence greater than the degree of adherence of the frangible layer to the exposed and to the unexposed photosensitive layer.

The dry peel-apart articles of the invention are based upon laminate structures containing at least two layers, one of which is a photosensitive layer. The photosensitive layer comprises a film-forming polymer, a photolabile blocked surfactant, and a spectral sensitizing compound which is effective with the photolabile blocked surfactant. Exposure of the photosensitive layer to radiation changes the surface active properties of the surfactant compound and thereby alters the adhesion of the photosensitive layer to an adjacent layer or the substrate. This change in adhesion may be developed to an image by applying an adhesive layer to the top surface and peeling apart.

Visible images may be provided by an article comprising a photosensitive layer on a support and frangible layer which is light-opaque or light-scattering or to which a toner or dye may be applied subsequently.

As used in the application:

"actinic radiation" means radiation in the wavelength range 300–900 nm which is absorbed by and produces lability of a masking group on a surfactant, and "photosensitive", "photolabile", and "light" are intended to describe properties over a wavelength range of 300–900 nm.

DESCRIPTION OF THE DRAWINGS

Let the interfacial adhesion between layers x and y be represented as $A(x,y)$, and if the adhesion value varies with exposure, let the exposed adhesion value be represented by $EA(x,y)$ which is relevant only to layer interfaces (4,6) and (6,8) since layer 6 is the photosensitive layer. The cohesive strength of the layers is represented by $C_2$, $C_4$, etc. in the unexposed state, and $EC_6$ for the photosensitive layer in the exposed state. Referring to FIG. 2 of the Drawing we can say that requirements for good peel-apart imaging are:

Figure 1:
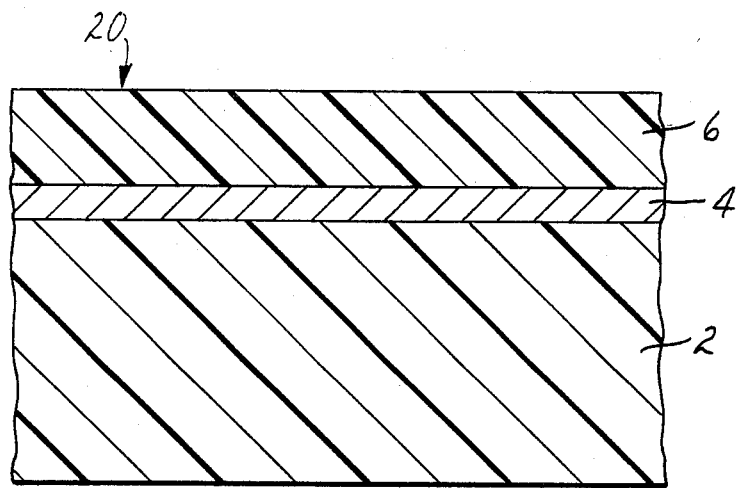
FIG. 1 shows a magnified cross-section of a laminate element 20, in which 2 is the support, 4 is the frangible layer, and 6 is the photosensitive layer.

$A(4,6) > A(2,4) > EA(4,6)$, and $A(2,4) < A(6,8)$, $EA(6,8)$, $A(8,10)$, $C_{10}$, $C_8$, $C_6$, $EC_6$, $C_1$ and $C_2$.

In addition, for frangible layer 4, the shear strength is sufficiently small and the ductility sufficiently low such that edges between exposed and unexposed areas may be sharp and smooth. Such an assembly gives a negative-acting system. However, in FIG. 3 it is shown that altering the layer order but using similar layer constructions gives a positive-acting system with requirements:

$A(6,4) > A(4,8) > EA(6,4)$, and $EA(6,4) < EA(2,6)$, $EC_6$, and $A(4,8) > A(2,6)$, $A(6,4)$, $A(8,10)$, $C_{10}$, $C_8$, $C_6$, $C_4$, and $C_2$, and for frangible layer 4, the shear strength is sufficiently small and the ductility sufficiently low such that edges between exposed and unexposed areas may be sharp and smooth.

DETAILED DESCRIPTION

The present invention provides a photosensitive, imageable article selected from Articles I and II:

Article I provides a support bearing on at least one surface thereof of negative-acting imageable member comprising in sequence:
(1) a frangible, thin, preferably light-opaque layer,
(2) a photosensitive layer comprising a blend of:
 (a) a light-transmissive film-forming polymeric material,
 (b) at least one photolabile blocked surfactant capable upon exposure to at least one wavelength of near UV, visible, or near IR radiation in the range of 300 to 900 nm of releasing a detectable amount of surfactant in the exposed areas, and
 (c) at least one spectral sensitizing compound capable of conferring sensitivity to said surfactant to radiation within the range of 300 to 900 nm, and
(3) optionally, a substrate strippably adhered to said imageable member wherein the peel strength of the unexposed photosensitive layer to the frangible layer is greater than the peel strength of the frangible layer to the support, and wherein the peel strength of the exposed photosensitive layer to the frangible layer respectively is less than the peel strength of the frangible layer to the support; and Article II provides a support, which preferably is light-transmissive, bearing on at least one surface thereof a positive-acting imageable member comprising in sequence,
(1) a photosensitive layer comprising a blend of:
 (a) a light-transmissive film forming polymeric material, (b) at least one photolabile blocked surfactant capable upon exposure to at least one wavelength of near UV, visible or near IR radiation in the wavelength range of 300 to 900 nm of releasing surfactant in the exposed areas, and (c) at least one spectral sensitizing compound capable of conferring sensitivity to the surfactant to radiation within the range of 300 to 900 nm, and (2) a frangible, thin, preferably light-opaque layer, and (3) optionally, a substrate strippably-adhered to said imageable member, wherein the peel strength of the unexposed photosensitive layer to said frangible layer is greater than the peel strength of said frangible layer to the strippably-adhered substrate, and the peel strength of the exposed photosensitive layer to the frangible layer is less than the peel strength of the frangible layer to the strippably-adhered substrate.

Preferably, the degree of difference in peel strengths between (a) the frangible layer and the photosensitive layer and (b) the frangible layer and the strippably-adhered substrate is at least 10 percent both in the unexposed article and the photoactivated article. This range of 10 percent difference has been established in detailed studies by Eiichi Inoue disclosed in Nippon Shashin Gakkai-Shi 41, (4), 245–252 (1978).

The present invention also provides an imaging process selected from Processes I and II:

Process I comprises the steps of:

a. providing a support having bonded to one surface thereof a negative-acting imageable member comprising in sequence (1) a frangible, thin, preferably light-opaque, layer, (2) a photosensitive layer comprising a blend of:

(a) light-transmissive film-forming polymeric material;

(b) at least one photolabile blocked surfactant capable upon exposure to radiation in the wavelength range of 300 to 900 nm of releasing a detectable amount of surfactant in the exposed areas, and (c) at least one spectral sensitizing compound capable of conferring sensitivity to said surfactant to radiation within the wavelength range of 300 to 900 nm, and wherein the peel strength of the unexposed photosensitive layer to said frangible layer is greater than the peel strength of said frangible layer to said support, b. exposing said photosensitive layer to radiation to which it is sensitive in an image-wise pattern at an intensity and for a time sufficient to release an image-wise pattern of released surfactant in the exposed area, wherein the peel strength of the exposed photosensitive layer to said frangible layer become less than the peel strength of said frangible layer to said support, c. applying to the surface of the resulting imaged photosensitive layer an adherent layer which is on at least one surface of a substrate, and d. separating the adherent and photosensitive layers from said support whereby in the exposed areas the frangible layer remains on said support whereas in the unexposed areas the frangible layer is removed from said support; and Process II comprises the steps of:

a. providing a support, which preferably is light-transmissive, having bonded to one surface thereof a positive-acting imageable member comprising in sequence (1) a photosensitive layer comprising a blend of:

(a) light-transmissive film-forming polymeric material;

(b) at least one photolabile blocked surfactant capable upon exposure to radiation in the wavelength range of 300 to 900 nm of releasing a detectable amount of surfactant in the exposed areas, and (c) at least one spectral sensitizing compound capable of conferring sensitivity to said surfactant to radiation within the wavelength range of 300 to 900 nm, and (2) a frangible, thin, preferably light-opaque layer, b. exposing said photosensitive layer through the support to radiation to which it is sensitive in an image-wise pattern at an intensity and for a time sufficient to release an image-wise pattern of released surfactant in the exposed area, c. applying to the surface of the frangible layer an adherent layer on at least one surface of a substrate, wherein the peel strength of the unexposed photosensitive layer to said frangible layer is greater than the peel strength of said frangible layer to said adherent layer and the peel strength of the exposed photosensitive layer to said frangible layer is less than the peel strength of said adherent layer to said frangible layer, d. separating the adherent layer from said actinic light sensitive area whereby the frangible layer in exposed areas is removed from the photosensitive layer and the frangible layer in unexposed areas remains on the photosensitive layer.

In the imaged articles of the invention contrast is high, the system being of the "on-off" type. The density of the imaged article is determined by the composition of the frangible layer. The $D_{min}$ is normally very low. Optical density of the imaged article between 3 and 4 are common and densities in excess of 4 are easily attained.

Figure 2:
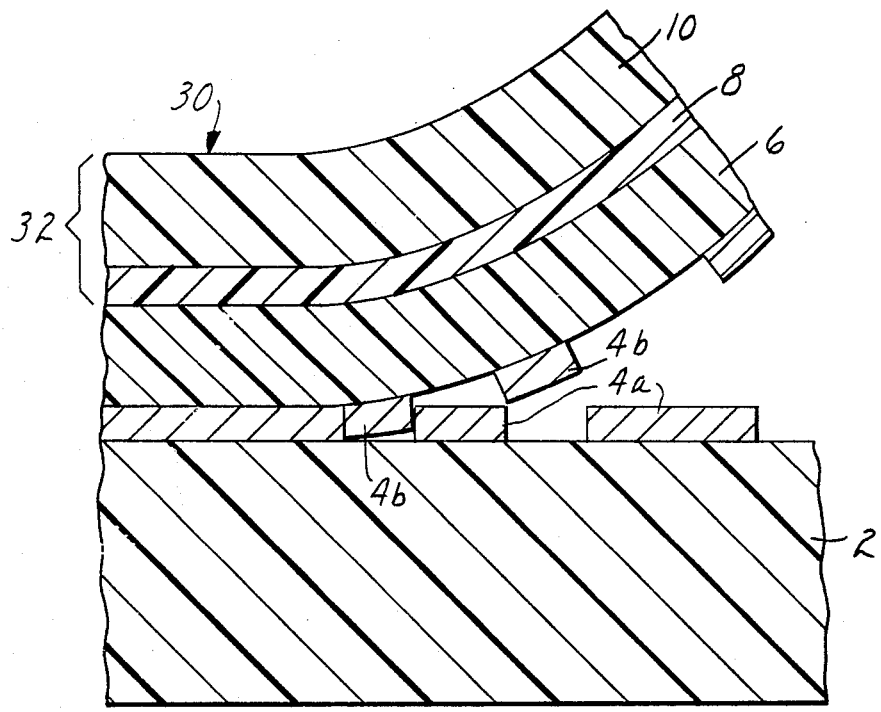
FIG. 2 shows a magnified cross-section of imageable article 30 showing part of a laminate in which some areas have been exposed and other areas have not. A pressure-sensitive adhesive (PSA) tape 32 has been applied to photosensitive layer 6 and peel-apart development to give a negative image has been partially completed. Differential adhesion between frangible layer 4 and photosensitive layer 6 has resulted from the differential exposure.

A preferred embodiment of the invention is shown in FIG. 1 and comprises a transparent support 2 bearing a layer of unexposed opaque frangible material 4a and photosensitive layer 6 composed of a film-forming polymer, a photolabile blocked surfactant, and a spectral sensitizer. As shown in the negative-acting system of FIG. 2, exposure to light is capable of decreasing the interfacial adhesion between the exposed frangible layer 4b and photosensitive layer 6; selective exposure of some areas and not others results in equivalent areas of reduced and unreduced adhesion; applied adhesive layer 8 and substrate 10 which together provide PSA tape 32 can be used for the purpose of peel development of the film from the support. The adhesion between adhesive layer 8 and substrate 10 is greater than the adhesion between any of the other interfaces in the article. This may be used to provide a negative image of frangible material on the support and a complementary positive image of frangible material on the peel development layer as in FIG. 2, or the opposite mode as in FIG. 3.

Figure 3:
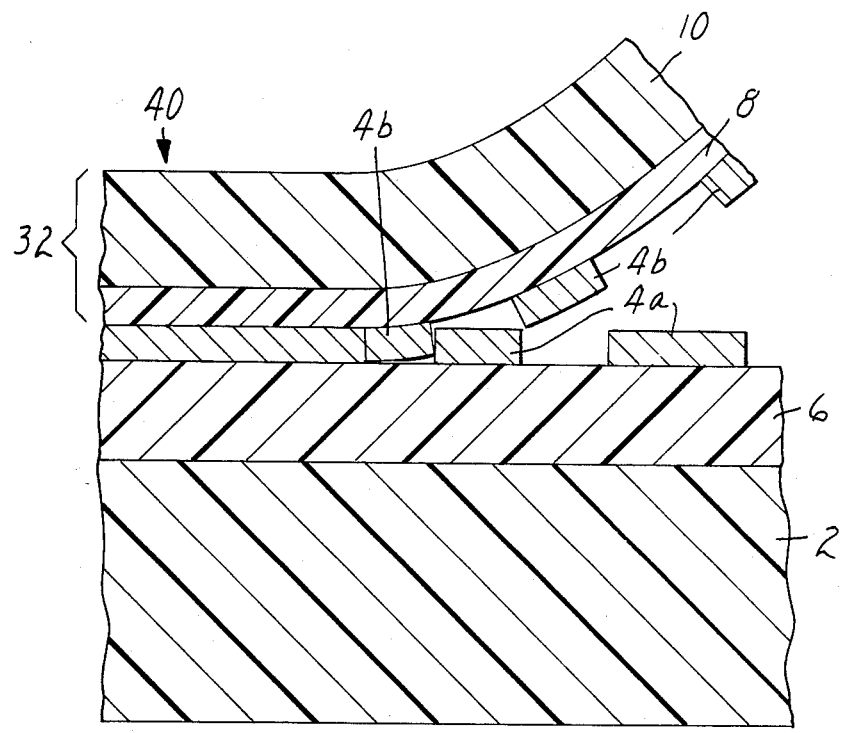
FIG. 3 shows a magnified cross-section of imageable article 40 which operates in the opposite imaging sense (i.e., it is positive-acting) to that of FIG. 2.

In the positive-acting system of FIG. 3 photosensitive layer 6 of article 40 is coated onto support 2 and frangible layer 4a is coated onto photosensitive layer 6. PSA tape 32 is applied to frangible layer 4a so that on peel development in exposed areas frangible layer 4b is released from photosensitive layer 6 whereas in unexposed areas frangible layer 4a remains attached to photosensitive layer 6. The adhesion between adhesive layer 8 and substrate 10 is greater than the adhesion between any of the other interfaces in the article. Additional embodiments and detailed drawing thereof are shown in U.S. Pat. No. 4,369,244 which is incorporated herein by reference.

The photolabile blocked surfactants useful in the present invention are surfactants (i.e., compounds characterized by having a hydrophobic group and at least one polar hydrophilic group) in which the polar group(s) is masked by a covalently bonded photolabile masking group. Because of the photolabile mask, the masked surfactant has substantially reduced surfactant activity as compared with the same surfactant in the unmasked state, and, on exposure to suitable radiation, the mask is removed, substantially restoring the surfactant to its original surface activity.

Specifically, the photolabile blocked surfactant compounds useful in the present invention, which by means of certain sensitizing compounds are sensitized to radiation in the wavelength range 300 to 900 nm, have the general formula $$(P-X)_a R_b,$$

wherein $(-X)_a R_b$ is the hydrogen-eliminated residue of a surfactant having the formula $(H-X)_a R_b$ including the polar divalent radical X; P is a covalently bonded photolabile masking group which prior to exposure to actinic radiation masks the polar properties of X and upon exposure to actinic radiation will unmask the polar properties of X, and R is a hydrophobic group which provides in the surfactant $(H-X)_a R_b$ a critical micelle concentration (CMC), represented by log (CMC) values equal to or less than $-2$, wherein a is a number 1 or 2 to satisfy the valence of R and b equals 1 or 2 to satisfy the valence of X. P, X, and R are defined below.

If $$X = -O-\overset{\overset{\displaystyle O}{\|}}{C}-,$$

then b=1 and a=1 or 2.

If $$X = -O\overset{\overset{\displaystyle O}{\|}}{\underset{\underset{\displaystyle O}{\|}}{S}}- \text{ or } -O-\overset{\overset{\displaystyle O}{\|}}{\underset{\underset{\displaystyle OH}{|}}{P}}-O-,$$

then b=1 and a=1.

If $$X = -O-\overset{\overset{\displaystyle O}{\|}}{\underset{\underset{\displaystyle O}{\|}}{P}}-O-,$$

then b=2 and a=1.

The following test may be used to obtain peel force values of coated layers. A candidate film-forming binder and surfactant mixture is coated onto a frangible, metallized (e.g., aluminized) surface. A firmly adherent metal coating must be used in this procedure. The peel force necessary to strip the dried coating from the metallized surface pulling at a 180° angle at a rate of 5 cm/sec. is determined. An adhesive tape (such as 3M Scotch® Brand Transparent Tape) may be used to grasp the film.

The criticality of these peel force values can be readily seen if the dynamics of the process are analyzed.

The metal layer on the substrate must be strippable from the substrate at a peel force between 0.8 and 40 g/cm in order to provide a useful imaging base. A lower degree of adhesion allows the entire metal layer or portions thereof to be too readily removed and a higher degree of adhesion is too difficult to remove. The process of forming an image requires a change in the peel force value so that it becomes less than the adhesion value for the metal layer to the support 2 or to the strippably adhered layer 8 respectively where it initially was equal to those respective values. As the peel force value of frangible layer to support or frangible layer to adhered layer must be between 0.8 and 40 g/cm, the range of the peel force values between non-exposed and exposed binder/blocked surfactant compositions must include a portion of that 0.8 to 40 g/cm range if it is to be capable of overlapping and extending both above and below the adhesion value of the frangible layer to support or the frangible layer to the substrate. The above-described test thus provides a simple and efficient test for useful materials. Succinctly put, photosensitive blocked surfactants are those surfactants which, when present in an organic polymeric binder, provide the binder/blocked surfactant composition with a range between its unexposed and exposed values which overlays at least a part of 0.8 to 40 g/cm.

As has already been pointed out, and as is shown in Example 17 below, masking groups P which are substituted in such a way as to make them sensitive to far blue or near UV light are not very stable in the unexposed condition, that is, the surfactant tends to be gradually released in the absence of any exposing radiation. Stable masking groups P have photosensitivity at shorter wavelengths for example 250-300 nm.

The present disclosure shows that certain of the known masking groups P may be spectrally-sensitized by the addition of suitable dyes or pigments to the composition. Surprisingly, it is certain of the masking groups with sensitivity in the 250-300 nm wavelength region which can be spectrally-sensitized by means of spectral sensitizing compounds so as to become sensitive in a wavelength region of 300 to 900 nm. Certain known masking groups with substituents to give sensitivity in the 300-400 nm wavelength region are found not to be capable of spectral sensitization. It has been found further that the masking groups P suitable for such spectral sensitization, such as the nitrobenzyl group, are those exhibiting electron accepting properties and that spectral sensitizers such as 2-chlorothioxanthone, Michler's ketone, and polyaromatics such as EDMA (2-ethyl-9,10-dimethoxyanthracene), DEA (9,10-diethoxyanthracene), and 5,10-diethoxy-16,17-dimethoxy violanthrene give dramatic increases in speed even though several of these compounds have triplet energies well below that of nitrobenzene. An explanation for this behavior is that the latter group of compounds sensitize via photo-induced electron transfer rather than energy transfer.

Suitable photolabile masking groups P are those which have half-wave reduction potentials (versus standard calomel electrode potentials) of $-1.5$ volts or more positive. Examples of suitable masking groups P are halo-substituted ethyl groups, benzyl groups substituted with nitro and/or nitrile groups and related condensed ring groups, e.g., $CBr_3CH_2-$, $CCl_3CH_2-$, -continued
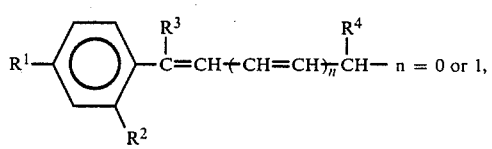 n = 0 or 1,
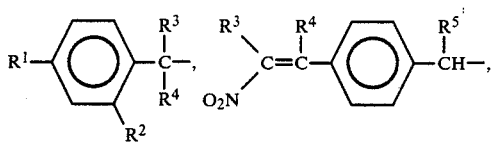
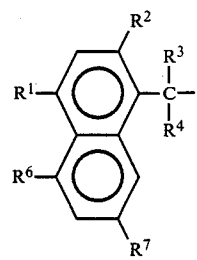
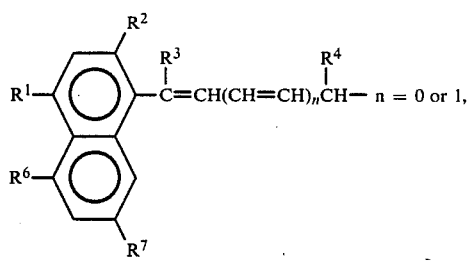 n = 0 or 1,
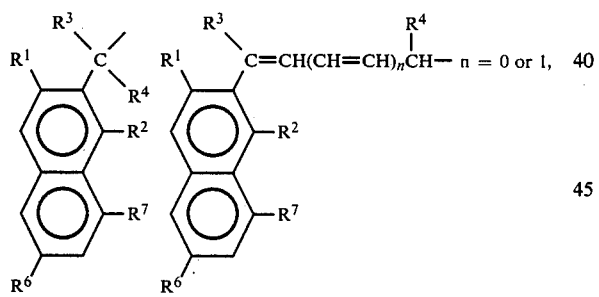 n = 0 or 1,
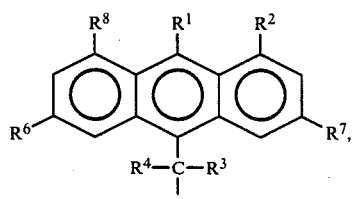
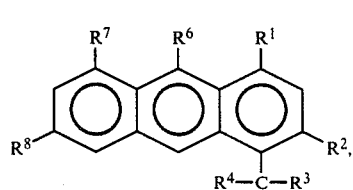
-continued
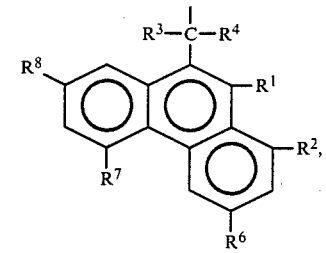
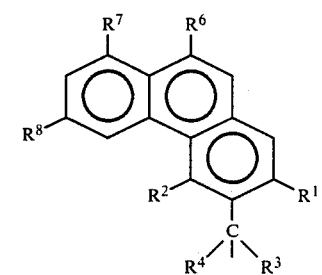
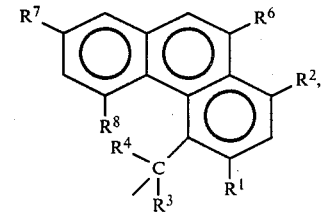
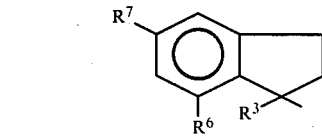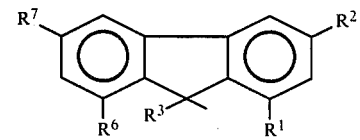
in which
$R^1$, $R^2$, $R^6$, $R^7$, $R^8$ are independently chosen from the group consisting of H, $NO_2$, CN and other radicals with Hammett Sigma constants greater then +0.5 providing that at least one of $R^1$, $R^2$, $R^6$, $R^7$ and $R^8$ is not H, and $R^3$, $R^4$, $R^5$ independently are H, alkyl or alkenyl of $C_1$–$C_4$, phenyl, styryl, or phenyl or styryl substituted by, for example, alkyl or alkoxy groups having 1 to 12 carbon atoms, nitro, halo, $SO_3$, carboxyl, amide, amine, and thio groups, X is a group selected from

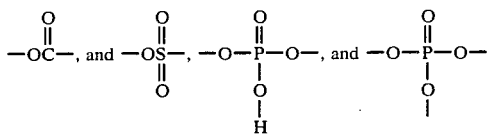

and

R is selected from

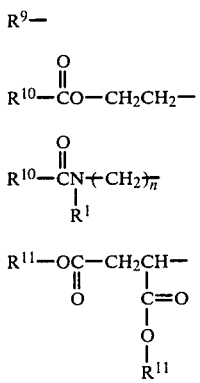

wherein $R^9$ is:
(1) a straight chain alkyl, alkenyl, alkynyl or alkylphenyl group having 12 to 30 carbon atoms, or
(2) a perfluoroalkyl, -alkenyl, or -alkynyl group having 7 to 30 carbon atoms;

$R^{10}$ is a straight chain alkyl, alkenyl, alkynyl or alkylphenyl group having 11 to 30 carbon atoms, or a perfluoroalkyl group having 7 to 30 carbon atoms;

$R^{11}$ is a straight chain alkyl, alkenyl, alkynyl, alkylphenyl or perfluoroalkyl, -alkenyl, or -alkynyl group, all having 7 to 30 carbon atoms; and n is 1 to 2.

It has been found that certain surfactants (e.g., carboxyls) are less easily released from the masked form. In these cases it is particularly advantageous to have substituents in the $R^3$, $R^4$, $R^5$ portions because this tends to stabilize the radical formed by the photorelease of the masking group. This method of stabilizing benzylic radicals is discussed in J. D. Roberts and by M. C. Caserio, "Basic Principles of Organic Chemistry", 946–948, W. A. Benjamin Inc., New York (1964).

Spectral sensitizing compounds suitable for this invention include those disclosed in the art as being suitable for the spectral sensitization of photolyzable organic halogen compounds, and sulfonium and iodonium salts. It has been found that compounds such as

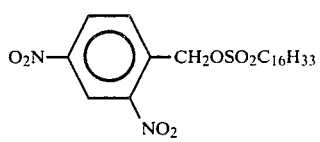

can be photochemically-sensitized to release surfactant. This widens the choice of labile masking groups with thermal stability, thereby vastly extending the shelf-life of imageable articles.

Triplet energy sensitization of compounds of formula II would require an energy higher than the triplet energy of nitrobenzene of about 60 kcal/mole. As will be shown later in Table II, benzophenone, 4,4′-dimethoxybenzophenone, and anthrone give a very small increase in speed even though they have triplet energies above that of nitrobenzene. On the other hand, 2-chloro-thioxanthone, Michler's ketone, and polyaromatics such as EDMA (2-ethyl-9,10-dimethoxyanthracene), DEA (9,10-diethoxyanthracene) and 5,10-diethoxy-16,17-dimethoxy violanthrene give dramatic increases in speed even though several of these compounds have triplet energies well below that of nitrobenzene. An explanation for this behavior can be that the latter group of compounds sensitize via photoinduced electron transfer (equations 1–5) rather than energy transfer, but this explanation is not to be limiting upon the invention in any way.

1. $\text{Sens} \xrightarrow{h\nu} \text{Sens}^*$

2. $\text{Sens}^* + \text{II (see formula II above)} \longrightarrow \text{Sens}^+ \cdot + \text{II}^- \cdot$ 3. $\text{II}^- \cdot \longrightarrow (O_2N)_2C_6H_3CH_2 \cdot + C_{16}H_{33}SO_3^-$ 4. $\text{Sens}^+ + \text{RH} \longrightarrow \text{Sens H}^+ + \text{R} \cdot$ 5. $\text{Sens H}^+ + C_{16}H_{33}SO_3^- \longrightarrow C_{16}H_{33}SO_3H + \text{Sens}$ In general, the classes of spectral sensitizing compounds useful in this invention are those with at least one absorption peak in the wavelength range 300–900 nm and which act as electron donors on activation rather than triplet sensitizers. Suitable classes of sensitizers, members of which satisfy those requirements, are as follows:

Aromatic polycyclic hydrocarbons such as anthracenes, anthraquinones, pyrenes, perylenes, violanthrenes, etc. especially those containing electron donating substituents, Polymethine dyes which are effective as silver halide sensitizers as described for instance in "The Theory of the Photographic Process", by C. E. K. Mees and T. H. James, Macmillan Company, NY, Third Edition and in "Photographic Chemistry" by P. Glafkides, Vol. II, Fountain Press, London (1960), including cyanines, merocyanines, oxanols, hemicyanines, and azacyanines, Aminoketones, p-substituted aminostyryls, Xanthenes and thioxanthones, Fluorescent polyaryl compounds including polyarylenes, polyaryl polyenes, 2,5-diphenylisobenzofurans, 2,5-diarylfurans, 2,5-diarylthiofurans, 2,5-diarylpyrroles, 2,5-diarylcyclopentadienes, polyarylphenylenes, coumarins, and polyaryl-2-pyrazolines, and particularly members of this class disclosed in U.S. Pat. No. 4,250,053.

Members of these classes are capable of sensitizing bis(trichloromethyl)-s-triazines and sulfonium and iodonium salts and will respond positively to a test disclosed in U.S. Pat. Nos. 3,729,313, 3,741,7609, 3,808,006 and 4,069,054.

A standard test solution is prepared with the following composition:

5.0 parts of a 5% (weight by volume) solution in methanol of polyvinyl butyral (45,000-55,000 molecular weight, 0.9-13.0% hydroxyl content, Butvar ™ B76, Shawinigan Resins Co., Springfield, MA)

0.3 part of trimethylol propan trimethacrylate 0.03 part of 2-methyl-4,6-bis(trichloromethyl)-s-triazine (see Bull. Chem. Soc. Japan 42 pp. 2924-2930, 1969).

To this solution is added 0.01 part of the material to be tested as a sensitizer. The solution is knife coated onto a 50 μm clear polyester film using a knife orifice of 50 μm, and the coating is air dried for about 30 minutes. Another 50 μm clear polyester film is carefully placed over the dried but soft and tacky coating with minimum entrapment of air. The sandwich construction is then exposed for three minutes to 161,500 Lux of incident light from a tungsten light source providing light to both the visible and ultraviolet range (General Electric 650 watt FCH quartz-iodine lamp).

Exposure is made through a stencil so as to provide exposed and unexposed areas in the construction. After exposure the cover film is removed, and the coating is treated with a finely divided colored powder, such as a color toner powder of the type conventionally used in xerography. If the tested material is a sensitizer, the trimethylol propane trimethacrylate monomer in the light exposed areas will be polymerized by the light generated free radicals from the photolyzable organic halogen compound, i.e., 2-methyl-4,6-bis(trichloromethyl)-s-triazine. Since the polymerized areas are essentially tack free, the colored powder will selectively adhere only to the tacky, unexposed areas of the coating, providing a visual image corresponding to that in the stencil.

Table I shows some explicit structures of sensitizers included in the above classes which have been found valuable in this invention.

TABLE I

1. $\lambda_m = 386$ nm

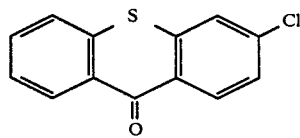

2. Michler's ketone $\lambda_m = 368$ nm

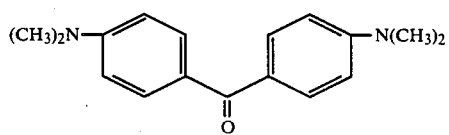

3. DEA, $\lambda_m = 400$ nm

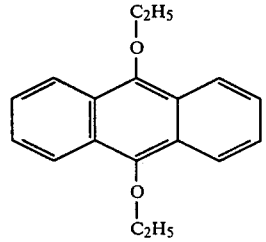

4. EDMA, $\lambda_m = 407$ nm

TABLE I-continued

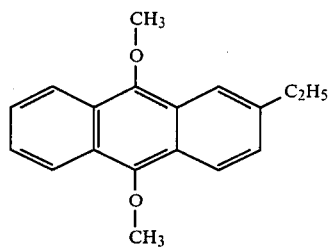

5. 5,10-diethoxy-16,17-dimethoxy violanthrene, $\lambda_m = 452$ nm & 528 nm

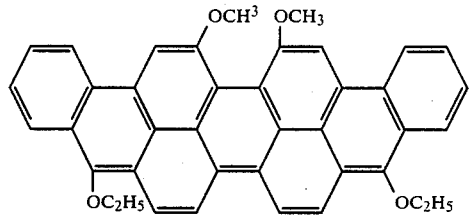

6. 3,16,17-trichloro-5,10-diethoxy violanthrene, $\lambda_m = 545$ nm

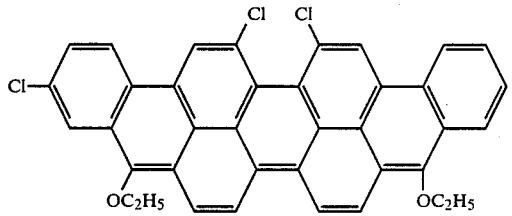

7. Anthracene, $\lambda_m = 375$ nm

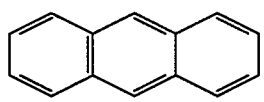

8. 3,3'diethylthiadicarbocyanine iodide, $\lambda_m = 653$ nm

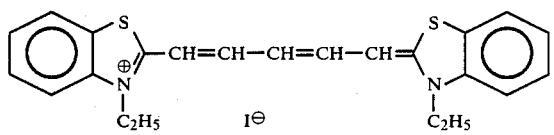

9. $\lambda_m = 571$ nm

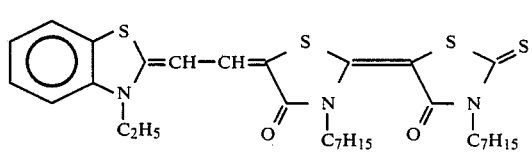

10. 3,3'Diethylthiatricarbocyanine iodide, $\lambda_m = 763$ nm

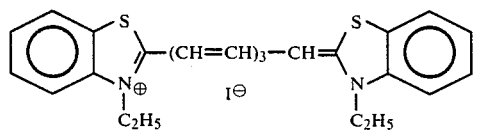

Oxanol type

TABLE I-continued

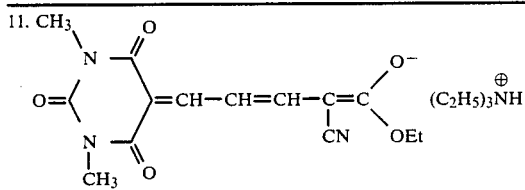
11. $\lambda_m = 460$ nm

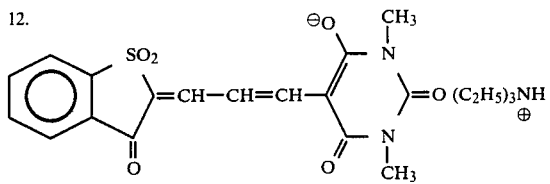
12. $\lambda_m = 525$ nm

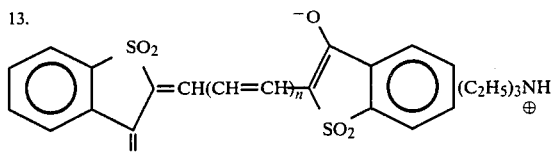
13. n = 1: $\lambda_m = 549$ nm
n = 2: $\lambda_m = 649$ nm

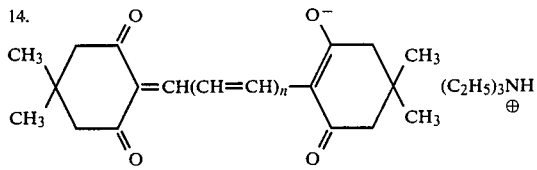
14. n = 1: $\lambda_m = 499$ nm
n = 2: $\lambda_m = 599$ nm

Other

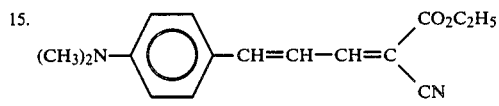
15. $\lambda_m = 466$ nm

Squarylium Type

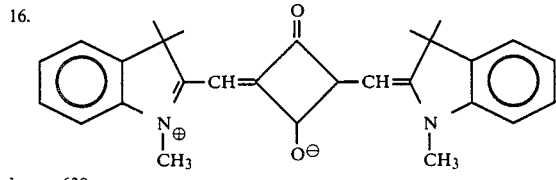
16. $\lambda_m = 630$ nm

Spectral sensitizing compounds are present in an amount 0.1 to 5.0 times compared to the weight of the blocked surfactant, preferably 0.25 to 1.5 times such weight.

The film-forming binder components of the radiation-activatable composition of the invention are thermoplastic organic polymers preferably having a molecular weight of at least 10,000. Suitable polymers include: (a) copolyesters based on terephthalic, isophthalic, sebacic, adipic, and hexahydrophthalic acids; such polyesters are sold under the trade designation Vitel TM by the Goodyear Tire and Rubber Company, (b) alkyd resins based on phthalic anhydride and glycerine available from Enterprise Paint Company under the trade designation EPIC TM Varnish, (c) polyamides such as poly(-hexamethyleneadipamide) and poly caprolactam, (d) vinyl acetate polymers such as that available under the trade designation VINAC TM ASB516 from Air Products Company and vinyl chloride copolymers such as the copolymer with vinyl acetate, e.g., those sold under the trade designation VMCH TM, VAGH TM or VYHH TM by the Union Carbide Company and under the trade designation "Geon" resin by the B. F. Goodrich Company, (e) vinylidene chloride copolymers, ethylene copolymers, e.g., ethylene or propylene and vinyl acetate, (g) polyacrylates such as polymethyl methacrylate and the copolymers of acrylic acid esters with other ethylenically unsaturated monomers, e.g., that sold under the trade designation Carboset 525 TM by the B. F. Goodrich Company and methacrylate resins such as that sold under the trade designation Elvacite TM by the DuPont Company, the pressure sensitive adhesive copolymers of "soft" acrylic esters such as butyl or isooctyl acrylate and a "hard" monomer such as acrylic acid or acrylamide, (h) cellulose esters such as cellulose acetate/butyrate, (i) polyvinyl acetals such as polyvinyl butyral, (j) polyurethanes such as that sold by B. F. Goodrich Company under the trade designation Estane 5715 TM, (k) the polycarbonates, and (l) styrene-maleic anhydride or maleic acid copolymers such as SMA-1000A TM (Arco Chemical Co., Philadelphia, PA).

Various additives, such as coating aids, wetting agents, plasticizers, ultraviolet absorbers and non-active dyes (as long as they do not absorb in the wavelength range of the sensitizing compound) can be added to the photosensitive composition in amounts and for purposes that are well known. Plasticization of the film provides improved sensitivity over unplasticized films. Plasticizers which have been found useful, for example, are the phthalic acid diesters such as dioctylphthalate, sebacic acid diesters such as Monoplex TM DOS from Rohm and Haas Co., and liquid polyoxyethylene containing compounds such as Triton TM X-100 from Rohm and Haas Co., Tergitol TM TMN-10 from Union Carbide Corp. and polyoxyethylene compounds such as triethylene glycol and Carbowax TM 300,400 and 1540 from Union Carbide Corp. The role of the plasticizer is thought to be to increase the mobility of the photosensitizer in polymeric binders and therefore increases the efficiency of sensitization of the masked surfactants. Plasticizers can be added to the photosensitive layer in an amount in the range of 0.1 to 10 weight percent of the coating solution. Particulate material such as pigments, e.g., carbon black, clays, titanium dioxide, umber ochre and the like, microfibers, glass microspheres, alumina, etc., may also be added; however, only small amounts, i.e., less than about 5 weight percent, can be tolerated since the surfactant liberated on irradiation will tend to orient about particulate material and be lost at the substrate surface.

The support for bearing the photosensitive and frangible image-forming layers may be made substantially of any solid material including glass, metal, ceramic, paper and film-forming thermoplastic polymeric material capable of accepting a thin layer of metal or inorganic compound thereon. Particularly suitable polymers include polyesters, acetates, polyolefins, polyamides, polyvinyl resins, polycarbonates, polyacrylates, and polymethacrylates such as polyethylene terephthalate, polyethylene, polypropylene, polyvinylchloride, polystyrene, polymethylmethacrylate, polyhexamethylene adipamide (nylon 6), polyvinylidene fluoride and polyvinylidene chloride. The support surface may be primed with or without subsequent subbing to reproducibly control the adhesion of the frangible layer to the support. For example, titanium dioxide dispersed in a coating solvent may be coated as a thin priming layer on polyester and aluminum then vacuum coated on top of it. Variation of the thickness of the titanium dioxide layer gives controlled variation of the peel-strength adhesion of the aluminum to the support. This in turn can give more latitude in the choice of surfactant system and the resultant adhesion values between the frangible layer and the photosensitive layer both before and after exposure, as described above. The thickness of the support is sufficient to permit peel-apart action when this feature is desired. Generally, a support having a thickness of at least 50 micrometers (2 mils) is useful for peel-apart imaging assemblies.

The support material may contain therein various additives such as pigment, dyestuff, and/or filler to give write-on properties, opacity, and coloration as is well known in the art.

The support can be coated with the photosensitive composition by any of the conventional means, including spray, brush, dip pad, rollcoating, wire-wound bar, curtain and knife techniques, and may, if desired, be dried under ambient or oven conditions to provide coating films on the support. The coating material is applied in such an amount that the dried photosensitive layer is from about 1 to 100 μm, preferably 10 to 40 μm, thick.

The strippably adhered substrate in peel-apart imaging assemblies of the invention may be of any of the above-mentioned materials providing they are flexible enough to be bent through an angle of at least 120° without cracking. Generally, substrates having a thickness in the range of 5 to 100 micrometers (0.2 to 4 mils) are useful.

The thin, frangible, preferably light-opaque layer may be a metal or metal compound layer on the surface of the support or the photosensitive layer and may be deposited by a variety of methods, such as vacuum evaporation, cathodic sputtering, electroless plating, and electrolytic plating. Substantially all metals may be included such as aluminum, zinc, tin, copper, gold, silver, bismuth, magnesium, chromium, iron and alloys of these metals. Inorganic compounds suitable for the thin layer include metal oxides such as the oxides of aluminum, zinc, tin, chromium and iron, and metal salts such as tin sulfide, zinc sulfide, cadmium sulfide which may be used above or in combination with the previously mentioned metals. The thickness of the metal-containing layer depends on the particular application desired. For example, a thinner layer may not possess sufficient light reflecting, absorbing or scattering properties to sufficiently attenuate a light beam for certain applications and a thick layer may give cracking and uneven cleavage along edges and consequent resolution reduction. Metal layers of 5 or 10 to 500 nm preferably may be employed while a thickness of 40–200 nm is more preferred.

The photosensitized coating compositions of the invention may be prepared by using any convenient method of mixing the film-forming binder, the photolabile surfactant, and the sensitizing compound in a suitable solvent. Generally, from about one to about ten parts, preferably about two to five parts by weight each of photolabile masked surfactant and sensitizing compound are used per 100 parts by weight of film-forming binder. Solutions are prepared to contain about 10 to 50 weight percent concentration of solids, the concentration used being that which provides a solution having a viscosity most suitable to the method by which the composition is to be applied to the substrate.

Solvents for use in the photosensitive coating composition are chosen on the basis of the film-forming binder. Suitable solvents include ketones such as acetone, methylethylketones, and methylisobutylketone; aromatic hydrocarbons such as benzene and toluene; halocarbons such as chloroform, methylene chloride, and trichloroethylene; esters such as ethyl acetate and propyl butyrate; ethers such as diethyl ether, dioxane, and tetrahydrofuran; nitromethane; nitroethane; and acetonitrile.

The image producing element according to this invention is exposed to light through a desired pattern and subjected to a dry heat development. Peel development is used to produce a metal image corresponding to the original pattern on the substrate. Suitable radiation sources include carbon arcs, mercury arc lamps, fluorescent lamps with ultraviolet or visible radiation emitting phosphors, argon and xenon glow lamps, tungsten lamps, metal halide arc lamps or electronic flash units. The period for which the image producing element is exposed to light varies depending upon the type of photosensitive layer, the wavelength emitted from the light source and the illumination level. Mercury vapor arcs and tungsten lamps customarily used in the graphic arts and printing industries are used at a distance of 2.5 to 51 cm (1 to 20 inches) or more from the photosensitive layer to bring about release. Total radiation fluxes of 10 to 10,000 $\mu w/cm^2$ are generally suitable for use.

Dry heat development of the imaged films of this invention may be accomplished by a variety of methods including heated rollers, heated plates, heated air, and infrared heat sources. The period for which the imaged film is subjected to heat varies depending on the type of photosensitive layer, the exposure time and the temperature of the heat sources. Exposure and heat development of the film of this invention may be done sequentially or simultaneously.

After exposure and heat development, the film is peeled apart with the aid of an adhesive-bearing tape, which may be a pressure-sensitive adhesive tape (e.g., Scotch TM Magic Mending Tape (3M, St. Paul, MN)) or a heat activatable laminating film, such tape or laminating film being applied to the surface of the photosensitive layer either prior to exposure and heat development, after exposure but before heat development or after exposure and heat development. The peeling action may be done either manually or mechanically.

The articles of the invention may provide driographic and lithographic type printing plates, projection transparencies, and high resolution recording films. In addition, a peel-apart imaging article is provided which is useful in any application where high contrast, high density, and high resolution are required, for example, line image masters and printed circuits.

Objects and advantages of this invention are further illustrated by the following examples, but the particular materials and amounts thereof recited in these examples, as well as other conditions and details, should not be construed to unduly limit this invention. All percentage compositions are by weight.

EXAMPLE 1

Solutions composed of 15 percent Goodyear Vitel PE 222 TM polyester resin, 1.0 percent blocked surfactant having Formula II above and 1.6 percent photosensitizer (except 0.5 percent for sensitizer 5 in TABLE I, above) by weight in methyl ethyl ketone were hand coated with a No. 26 wire wound coating rod (about 60 μm wet thickness) onto 50 nm vapor coated aluminum on 100 μm thick polyester base and air dried to a tack free surface. Imagewise exposure of the film to a Berkey Ascor wedge exposure (a) followed by heating at 60° C. for 90 seconds and peel development (b) gave a solid image (steps) in aluminum on the polyester base (negative image). The relative imaging speed was calculated based on the exposure time and number of solid steps of aluminum left on the polyester after peeling apart. The results are presented in Table II.

TABLE II

| Sensitizer | Triplet energy $E_T$ (kcal/mole) | Speed relative to compound of formula II alone (a), (b) |
| --- | --- | --- |
| no sensitizer | — | 0[c] |
| no sensitizer | — | 1 |
| acetophenone | 73.6 | 1 |
| benzophenone | 68.8 | 2 |
| 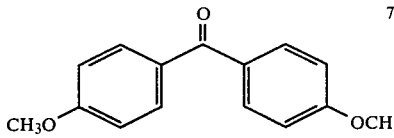 | 71.7 | 1.4 |
| 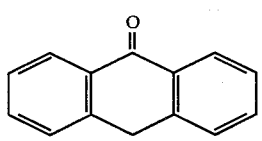 | 71.8 | 2 |
| 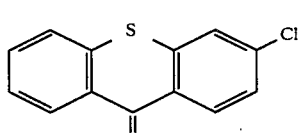 | 65 | 10 |
| 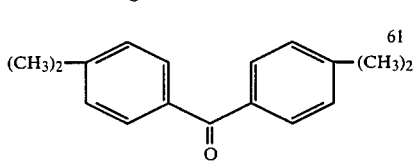 | 61 | 20 |
| 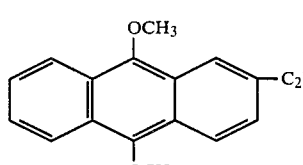 | less than 60 | 60 |
| 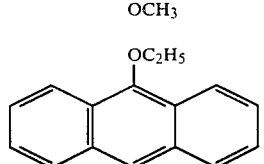 | less than 60 | 60 |
| 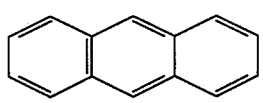 | 42 | 5 |
| 5,10-diethoxy-16,17-dimethoxy violanthrene | less than 60 | 10 20[c] |

The first four compounds have triplet energies greater than 65 kcal/mole but are not efficient sensitizers whereas the remaining compounds have triplet energies up to about 65 kcal/mole yet act as good sensitizers and appear to be electron donors. This illustrates the higher efficiency of electron donors because it is well known in the art that a sensitizer that has a triplet energy less than the triplet energy of an acceptor cannot act as an efficient triplet sensitizer.

(a) "Berkey Ascor wedge exposure"—exposure was made using the 2 KW unit with a No. 1406-02 photopolymer bulb at 45 cm. with the sample situated behind and in contact with a 21 step $\sqrt{2}$ interval Stouffer wedge tablet.

(b) "Peel development"—SCOTCH TM Magic Mending Tape was laminated to the sample surface and then peeled off in the direction of the long dimension of the tape at an angle of 180° between the laminated position and the peeled position. A slow uniform rate of peel was applied.

(c) Exposures were made with sample behind and in contact with a 21 step wedge tablet composed of neutral absorbers giving a 0.15 density step interval. An illumination level of 183,000 lux at the front surface of the wedge tablet was provided by a tungsten lamp running at a color temperature of about 2900° K. These conditions were provided by a Model 70 exposure unit (3M, St. Paul, MN).

EXAMPLE 2

Several benzyl derivatives were prepared and tested to define the scope of this invention.

Solutions composed of 15 percent Goodyear Vitel PE 222 polyester resin, 1.0 percent EDMA (2-ethyl-9,10-dimethoxyanthracene) and 1.0 percent blocked surfactant by weight in methyl ethyl ketone were hand coated with a No. 26 wire wound coating rod (about 60 μm wet thickness) onto 50 nm vapor coated aluminum on 100 μm thick polyester base and air dried to a tack free surface. The films were exposed to a Berkey Ascor wedge exposure followed by heating at 60° C. for 90 seconds and then peel development as in Example 1. TABLE III below summarizes the blocked surfactants, exposure times and number of steps of aluminum left on the polyester after peeling apart. TABLE III also shows the relative arithmetic imaging speed.

TABLE III

| | Blocked surfactant | Exposure time | Number of steps | Relative speed |
|---|---|---|---|---|
| I | 2,4-dimethoxy-5-nitrobenzyl -CH$_2$OSO$_2$C$_{16}$H$_{33}$ (CH$_3$O, CH$_3$O, NO$_2$ substituents) | 60 sec* | 0 | <2.5 |
| II | 2,4-dinitrobenzyl -CH$_2$OSO$_2$C$_{16}$H$_{33}$ (O$_2$N-, -NO$_2$) | 30 sec | 5 | 28 |
| III | 4-nitrobenzyl -CH$_2$OSO$_2$C$_{16}$H$_{33}$ (O$_2$N-) | 30 sec | 4 | 18 |
| IV | 2-nitrobenzyl -CH$_2$OSO$_2$C$_{16}$H$_{33}$ (NO$_2$) | 60 sec | 2 | 5 |
| V | 4-nitrobenzyl -CH$_2$O$_2$CC$_7$F$_{15}$ (O$_2$N-) | 60 sec | 1 | 3.5 |
| VI | 4-cyanobenzyl NC- -CH$_2$OSO$_2$C$_{16}$H$_{33}$ | 5 min | 2 | 1.0 |
| VII | O$_2$N- -CH$_2$O$_2$CCH$_2$N(CH$_3$)COC$_{17}$H$_{35}$ | 15 min | 0 | <0.17 |
| VIII | 2-nitrobenzyl -CH$_2$O$_2$CCH$_2$N(CH$_3$)COC$_{17}$H$_{35}$ (NO$_2$) | 5 min | 0 | <0.5 |
| IX | 3,5-dinitrobenzyl -CH$_2$OSO$_2$C$_{16}$H$_{33}$ (O$_2$N-, O$_2$N-) | 15 min | 0 | <0.17 |
| X | 3-nitrobenzyl -CH$_2$OSO$_2$C$_{16}$H$_{33}$ (O$_2$N-) | 5 min | 0 | <0.5 |

TABLE III-continued

| Blocked surfactant | Exposure time | Number of steps | Relative speed |
|---|---|---|---|
| XI 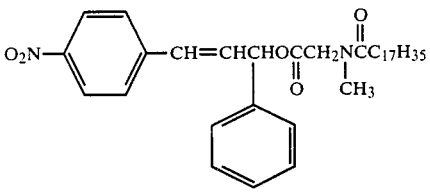 | 15 min | 3 | 0.5 |

*Exposure limited to wavelengths above 360 nm by use of cutoff filter to avoid near UV sensitivity of blocked surfactant itself The results of TABLE III indicate that ortho-nitro substitution is not a necessity and that para-cyano substitution also works although it is slower. Meta-nitro derivatives cannot be sensitized to give surfactant release. A number of conclusions can be drawn from benzyl derivatives that could be sensitized. The benzyl derivative must have a sufficiently low reduction potential for sensitization to occur. Sensitization depends on the leaving group ability of the blocked surfactant, i.e., sulfonate is better than fluorinated carboxylate which in turn is better than non-fluorinated carboxylate. Sensitization also depends on the stability of the radical formed by photorelease of the masking group, e.g., 1-phenyl-p-nitrocinnamyl radical (blocked surfactant XI) is more stable than the p-nitrobenzyl radical (blocked surfactant VII) and allows more efficient photorelease of surfactant as in the case of non-fluorinated carboxylate.

EXAMPLE 3

A solution composed of 15 percent Goodyear Vitel PE 222 polyester resin, 0.9 percent of blocked surfactant III and 0.9 percent 9,10-diethoxyanthracene (DEA) in methyl ethyl ketone was hand coated with a No. 26 coating rod (about 60 μm wet thickness) onto about 50 nm thick vapor coated aluminum layer on polyester base and air dried to a tack free surface. Imagewise exposure (Berkey Ascor wedge exposure for 60 seconds) followed by heating at 60° C. for 90 seconds and peel development gave a solid 5 steps in aluminum on the polyester base (negative image). The composite was subjected to accelerated aging for 7 days at 120° F. or 7 days at 105° F., 95 percent relative humidity. There was no evidence for film failure after 7 days but the imaging speed had decreased, i.e., 2 minute exposure and heating at 90° C. for 1 minute gave a solid 1 step in aluminum.

EXAMPLE 4

A solution identical to that used in Example 1 but containing 0.45 percent sensitizer 5 of TABLE I, above (λmax=528 nm) was similarly coated. Exposure for 30 seconds with a 3M Model 70 visible light source followed by heating at 60° C. for 90 seconds and peel development gave a solid 3 steps in aluminum. 3M Model 70 exposure for 80 seconds through a typed white paper (typing face down) followed by 90 seconds at 60° C. and tape peel gave a good negative line copy image of high contrast and optical density (density 2.5) that could be used as an overhead transparency.

EXAMPLE 5

A solution containing 15 percent Vitel PE 222, one percent blocked surfactant III, 0.58 percent eosin and 2.6 percent dioctylphthalate by weight in methyl ethyl ketone was coated as in EXAMPLE 1. The film was wedge exposed for 2 minutes with a 3M Model 70 exposure unit and heated 30 seconds at 95° C. Peel development left no aluminum on the polyester. This result indicates eosin does not efficiently sensitize 4-nitrobenzyl derivatives under these conditions.

EXAMPLE 6

Two imageable articles were prepared using the procedure of Example 1. In one sample the coating solution contained 15 percent Vitel Pe 222, 0.9 percent blocked surfactant VIII and 0.9 percent eosin in methylethylketone and the second sample contained a similar solution but without eosin. Both samples were Berkey Ascor wedge exposed for 5 minutes, heated at 60° C. for 90 seconds and peel developed. Both samples gave slight negative image formation but the sample without eosin showed more image than the sample with eosin. This result contradicts patents (U.S. Pat. Nos. 3,849,137 and 4,131,465) which state eosin sensitizes the photochemistry of o-nitrobenzyl derivatives.

EXAMPLE 7

A solution composed of 15 percent Goodyear Vitel PE 222 polyester resin, 1.2 percent $CBr_3CH_2OSO_2C_{16}H_{33}$, and 0.9 percent 9,10-diethoxyanthracene in methyl ethyl ketone was hand coated with a No. 26 wire wound bar to give about 60 μm wet thickness onto a 50 nm aluminum vapor coat on polyester base. The coating was dried to a tack free surface. Imagewise exposure with Berkey Ascor wedge exposure followed by peel development left 3 solid steps in aluminum on the polyester base (negative image).

EXAMPLE 8

A solution composed of 15 percent Goodyear Vitel PE 222 polyester resin, 0.4 percent blocked surfactant III and 0.3 percent by weight Sensitizer 9 (Tablet I) (λmax=571 nm) by weight in methyl ethyl ketone was hand coated with a No. 26 wire wound coating rod (about 60 μm wet thickness) onto 50 nm vapor coated aluminum on polyester base and air dried to a tack free surface. The film was wedge exposed for 30 seconds with a 3M Model 70 tungsten light source, heated one minute at 80° C. and peel developed to give 2 solid steps in aluminum left on the polyester.

EXAMPLE 9

Example 8 was repeated except that 2 percent by weight of a plasticizer, octylphenoxypolyethoxyethanol (Triton X-100 TM, Rohm and Haas Co.), was added to the coating solution. Exposure for 30 seconds followed by heating 1 minute at 80° C. and peel development -continued

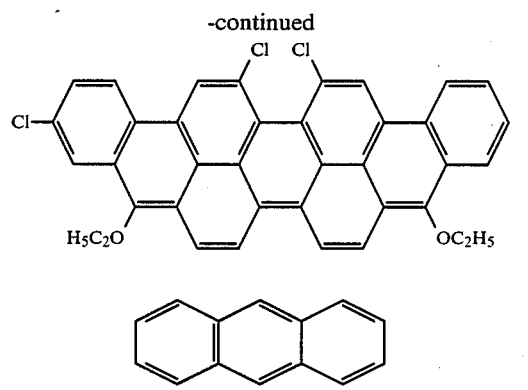

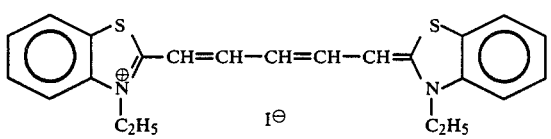

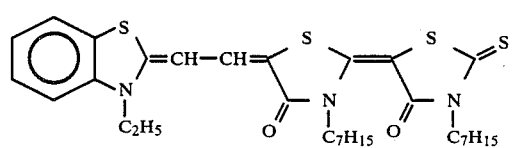

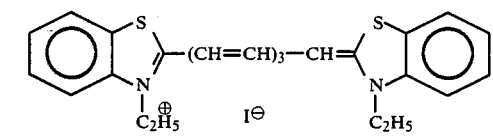

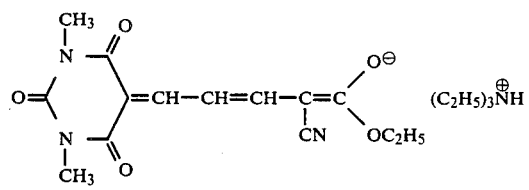

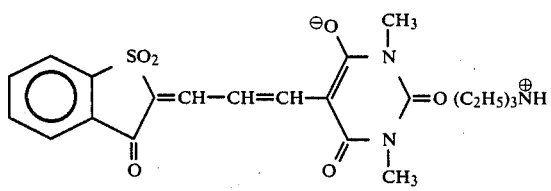

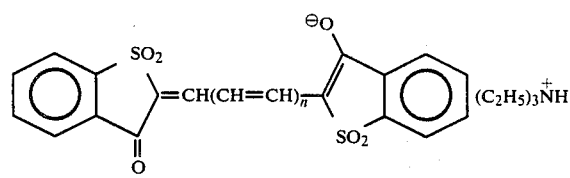

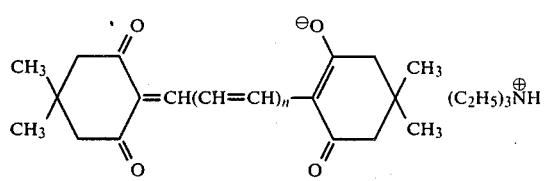

-continued

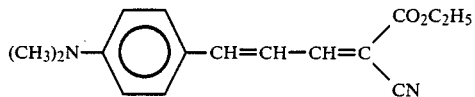

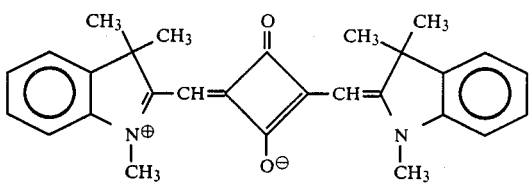

20. The process according to claim 16 wherein said photolabile blocked surfactant has the formula $$(P-X)_a R_b$$

wherein $(-X)_a R_b$ is the hydrogen-eliminated residue of a surfactant having the formula $(H-X)_a R_b$, X is a polar divalent radical selected from

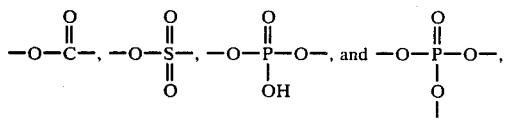

P is a photolabile blocking group selected from groups having a halfwave reduction potential relative to a standard calomel electrode equal to or more positive than −1.5 volts, R is a hydrophobic group which provides in the surfactant $(H-X)_a R_b$ a log (critical micelle concentration) equal to or less than −2, and "a" is a number 1 or 2 to satisfy the valency of R, and
"b" is a number 1 or 2 to satisfy the valency of X.

21. The process according to claim 20 wherein R is selected from

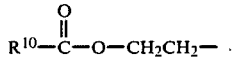

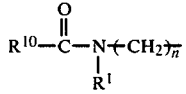

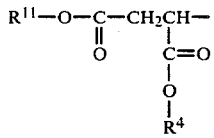

wherein $R^9$ is:
(1) a straight chain alkyl, alkenyl, alkynyl or alkylphenyl group having 12 to 30 carbon atoms or
(2) a perfluoroalkyl, -alkenyl, or -alkynyl group having 7 to 30 carbon atoms;

$R^{10}$ is a straight chain alkyl, alkenyl, alkynyl or alkylphenyl group having 11 to 30 carbon atoms or a perfluoroalkyl group having 7 to 30 carbon atoms;

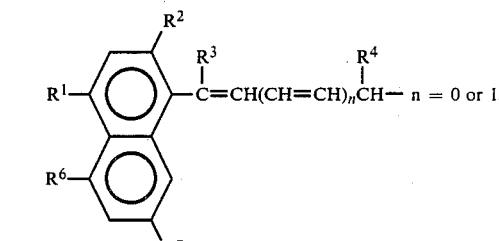
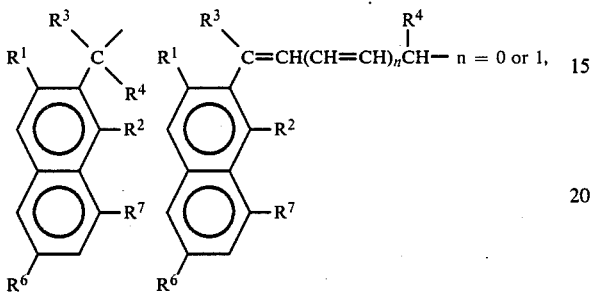
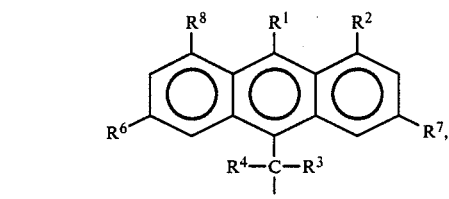
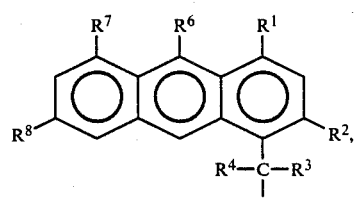
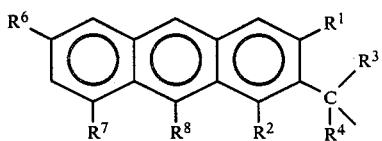
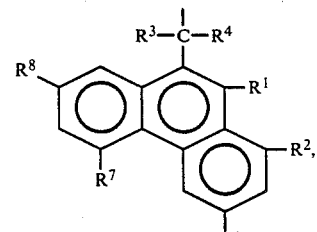
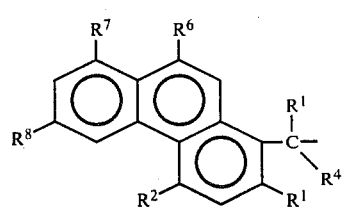
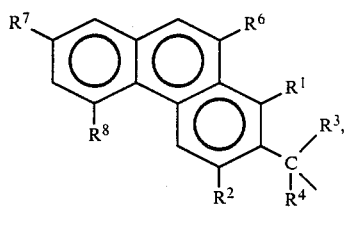
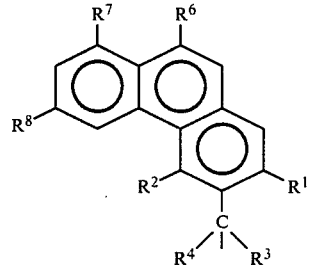
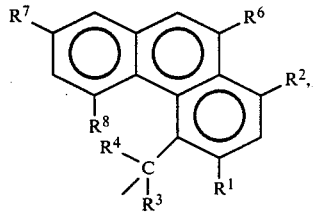
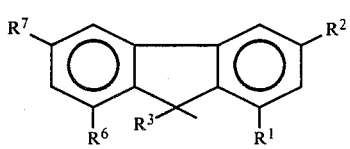
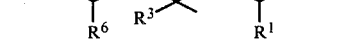

wherein
$R^1$, $R^2$, $R^6$, $R^7$, $R^8$ are independently chosen from the group consisting of H, $NO_2$, CN and other radicals with Hammett Sigma constants greater then +0.5 providing that at least one of $R^1$, $R^2$, $R^6$, $R^7$ and $R^8$ is not H;

$R^3$, $R^4$, $R^5$ are selected from the group consisting of H, alkyl of $C_1$ to $C_4$, alkenyl of $C_1$ to $C_4$, phenyl, styryl, substituted phenyl and substituted styryl.

11. The article of claim 3 wherein the degree of difference in peel strengths between (a) the frangible layer and the photosensitive layer and (b) the frangible layer and the support is at least 10 percent both in the unexposed article and the photoactivated article.

12. The article of claim 2 wherein said frangible layer comprises a metal, metal oxide, metal salts, or mixtures of metal and either metal oxide or metal salt.

13. The article of claim 3 wherein said frangible layer has a peel strength from said support or said unexposed photosensitive layer of 0.8 to 40 g/cm.

14. The article of claim 2 wherein said frangible layer comprises a metal having a thickness of 5 to 500 nm and a peel strength from said substrate or support of 0.8 to 40 g/cm.

15. The article of claim 2 further comprising a plasticizer present in said photosensitive layer in the range of 0.1 to 10 weight percent of the coating solution.

16. A process of forming an image chosen from Processes I and II wherein
Process I comprises the steps of:

-continued

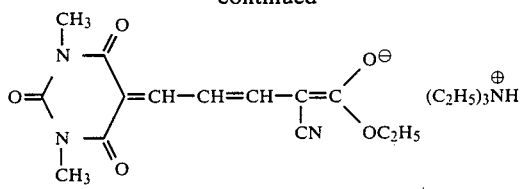

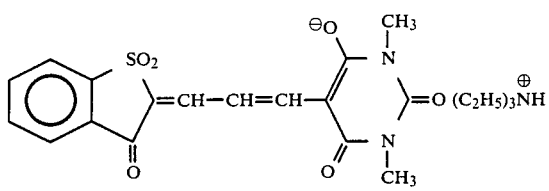

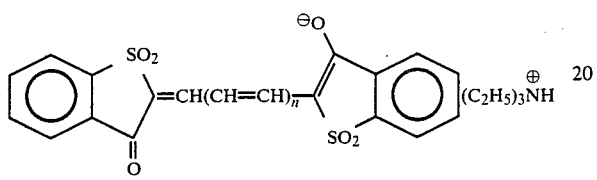

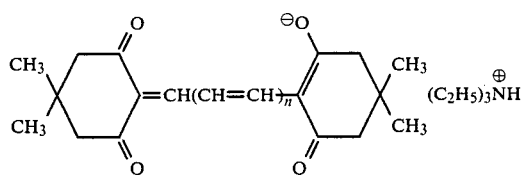

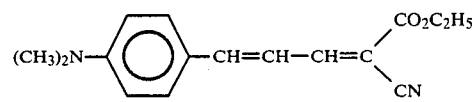

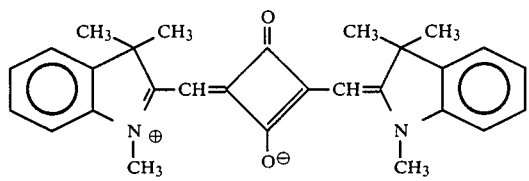

8. The article according to claim 2 wherein said photolabile blocked surfactant has the formula (P—X)$_a$R$_b$ wherein
(—X)$_a$R$_b$ is the hydrogen-eliminated residue of a surfactant having the formula (H—X)$_a$R$_b$,
X is a polar divalent radical selected from

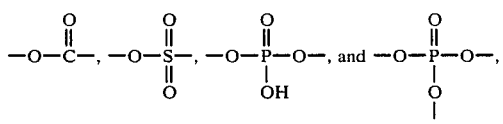

P is a photolabile blocking group selected from groups having a halfwave reduction potential relative to a standard calomel electrode equal to or more positive than −1.5 volts,
R is a hydrophobic group which provides in the surfactant (H—X)$_a$R$_b$ a log (critical micelle concentration) equal to or less than −2, and "a" is a number 1 or 2 to satisfy the valency of R, and
"b" is a number 1 or 2 to satisfy the valency of X.

9. The article according to claim 8 wherein R is selected from

R$^9$—

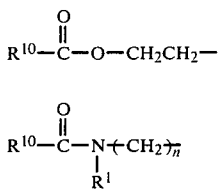

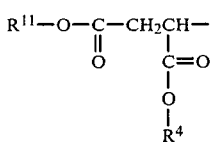

wherein R$^9$ is:
(1) a straight chain alkyl, alkenyl, alkynyl or alkylphenyl group having 12 to 30 carbon atoms or
(2) a perfluoroalkyl, -alkenyl, or -alkynyl group having 7 to 30 carbon atoms;
R$^{10}$ is a straight chain alkyl, alkenyl, alkynyl or alkylphenyl or group having 11 to 30 carbon atoms or a perfluoroalkyl group having 7 to 30 carbon atoms;
R$^{11}$ is a straight chain alkyl, alkenyl, alkynyl, alkylphenyl or perfluoroalkyl, -alkenyl, or -alkynyl group all having 7 to 30 carbon atoms; and
n is 1 or 2.

10. The article according to claim 8 wherein P is selected from

CBr$_3$CH$_2$—, CCl$_3$CH$_2$—,

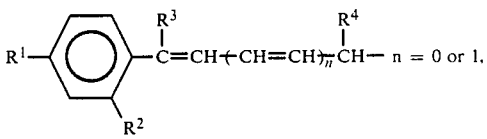

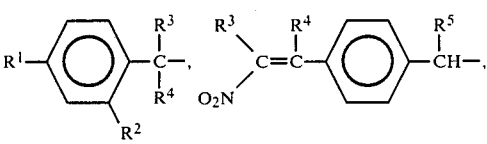

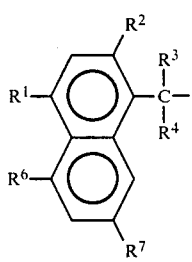

(1) a photosensitive layer comprising a blend of:
  (a) a light-transmissive film-forming polymeric material,
  (b) at least one covalently-bonded, electron-donating, photolabile blocked surfactant when in said blend being capable upon exposure to at least one wavelength of near UV, visible or near IR radiation in the wavelength range of 300 to 900 nm of releasing surfactant in the exposed areas, and
  (c) at least one electron-donating spectral sensitizing compound capable of conferring sensitivity to the surfactant to radiation within the wavelength range 300 to 900 nm, and
(2) a frangible, thin layer.

3. The photosensitive, imageable article according to claim 2 further comprising a strippably-adhered substrate selected from the group consisting of:
  a. a substrate strippably adhered to said photosensitive layer of Article I, wherein the peel strength of the unexposed photosensitive layer to said frangible layer is greater than the peel strength of the frangible layer to said support, and wherein the peel strength of the exposed photosensitive layer to said frangible layer respectively is less than the peel strength of said frangible layer to the support, and
  b. a substrate strippably-adhered to said frangible layer of Article II, wherein the peel strength of the unexposed photosensitive layer to said frangible layer is greater than the peel strength of said frangible layer to the strippably-adhered substrate, and the peel strength of the exposed photosensitive layer to the frangible layer is less than the peel strength of the frangible layer to said strippably-adhered substrate.

4. The photosensitive, imageable article according to claim 2 wherein said frangible layer attenuates a light beam by means selected from at least one of light absorption, light scattering, and light reflection.

5. The article according to claim 2 wherein said spectral sensitizing compound is selected from the group consisting of aromatic polycyclic hydrocarbons, polymethine dyes, aminoketones, xanthenes, thioxanthones, p-substituted aminostyryls, and fluorescent polyaryl compounds.

6. The article according to claim 2 wherein said spectral sensitizing compound is selected from the group consisting of anthracenes, anthraquinones, violanthrenes, cyanine dyes, hemicyanine dyes, merocyanine dyes, oxanol dyes, and squarylium dyes, which have at least one absorption peak in the wavelength range 300 nm to 900 nm, and which are electron donor sensitizers.

7. The article according to claim 2 wherein said spectral sensitizing compound is selected from the group consisting of

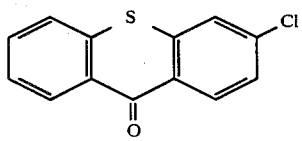

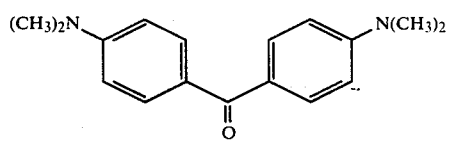

-continued

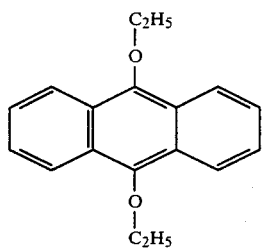

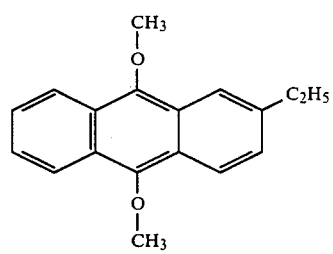

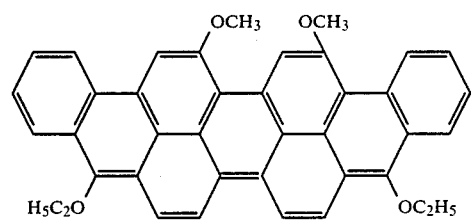

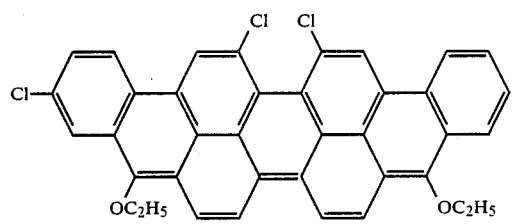

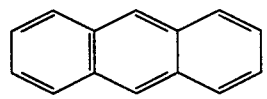

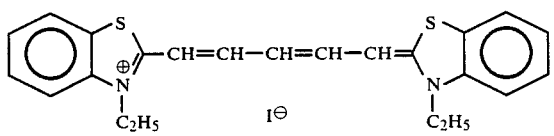

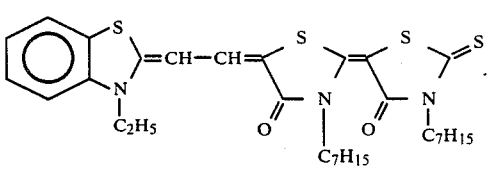

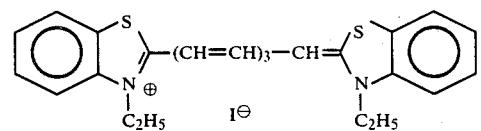

gave 4 solid steps in aluminum left on the polyester, thus illustrating improved sensitivity with Triton X-100 present.

EXAMPLE 10

Example 8 was repeated except that 0.4 percent by weight 3,3'-diethylthiadicarbocyanine iodide (sensitizer 8 Table I, λmax=653 nm) was used in place of sensitizer 9. Exposure for 60 seconds followed by heating 60 seconds at 80° C. and peel development gave no solid steps in aluminum on the polyester indicating little sensitivity.

EXAMPLE 11

Example 10 was repeated except that 1.7 weight percent of a plastizer, Triton X-100, was added to the coating solution. Exposure for 30 seconds following by heating 1 minute at 80° C. and peel development gave 6 steps in aluminum left on the polyester showing good sensitivity with the plasticizer added.

EXAMPLE 12

A solution containing 15 percent Vitel PE 222 TM, 0.4 percent blocked surfactant III and 0.1 percent sensitizer 16 (TABLE I) ($\lambda_{max}$=630 nm) by weight in methyl ethyl ketone was hand coated with a No. 26 wire wound coating rod onto 50 nm vapor-coated aluminum on polyester and air dried to a tack-free surface. The film was wedge exposed for two minutes with a 3M Model 70 light source, heated 45 seconds at 95° C., and peel developed to give 3 solid steps in aluminum left on the polyester.

EXAMPLE 13

Example 12 was repeated expect that 2.3 percent by weight of a plasticizer, dioctylphthalate, was added to the coating solution. The film was wedge exposed for one minute, heated 45 seconds at 95° C. and peel developed to give 9 solid steps in aluminum left on the polyester.

EXAMPLE 14

Example 12 was repeated except that 1.6 percent by weight of a plasticizer, Triton X-100 TM, was added to the coating solution. The film was wedge exposed for 20 seconds, heated one minute at 95° C. and peel developed to give 3 solid steps in aluminum left on the polyester.

Examples 9, 11, 13 and 14 demonstrated improved sensitivity when the film was plasticized.

EXAMPLE 15

A solution containing 15 weight percent Vitel PE 222 TM and 0.9 weight percent blocked surfactant, having in formula

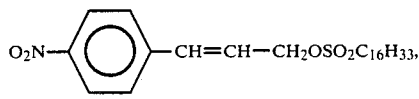

in methyl ethyl ketone was coated using the procedure of Example 1. Exposure in a Berkey Ascor wedge for 10 minutes followed by heating for 1 min at 80° C. and then peel apart development left no aluminum on the polyester. This indicated little or no sensitivity.

EXAMPLE 16

Example 12 was repeated except that 0.9 weight percent of 9,10-diethoxyanthracene was added to the coating solution. Berkey Ascor wedge exposure for 30 sec. was followed by heating for 1 min. at 80° C. After peel apart development, three solid steps in aluminum were left on the polyester base.

EXAMPLE 17

A solution composed of 15 weight percent Goodyear Vitel PE 222 polyester resin and 0.9 percent of blocked surfactant I in methyl ethyl ketone ws coated as in Example 3. Imagewise exposure (Berkey Ascor wedge exposure for 60 seconds) followed by heating at 60° C. for 90 seconds and peel development gave 5 solid steps in aluminum on the polyester base. The composite was subjected to accelerated aging for 7 days at 49° C. (120° F.) or 7 days at 41° C. (105° F.), 95 percent relative humidity. The film failed after 7 days, i.e., on peel development all the aluminum remained on the polyester base even in unexposed areas.

Various modifications and alterations of this invention will become apparent to those skilled in the art without departing from the scope and spirit of this invention, and it should be understood that this invention is not to be unduly limited to the illustrative embodiments set forth herein.

I claim:

1. A photosensitive layer comprising a blend of:
   (a) a light-transmissive film-forming polymeric material,
   (b) at least one covalently-bonded, electron-accepting photolabile blocked surfactant when in said blend being capable upon exposure to at least one wavelength of near UV, visible, or near IR radiation in the wavelength range 300 to 900 nm of releasing a detectable amount of surfactant in the exposed areas, and
   (c) at least one electron-donating spectral sensitizing compound capable of conferring sensitivity to said surfactant to radiation within the wavelength range 300 to 900 nm.

2. A photosensitive, imageable article selected from Article I and Article II:
Article I comprises:
   a support bearing on at least one surface thereof a negative-acting imageable member comprising in sequence:
   (1) frangible, thin layer,
   (2) a photosensitive layer comprising a blend of:
      (a) a light-transmissive film-forming polymeric material,
      (b) at least one covalently-bonded, electron-accepting, photolabile blocked surfactant when in said blend being capable upon exposure to at least one wavelength of near UV, visible, or near IR radiation in the wavelength range 300 to 900 nm of releasing a detectable amount of surfactant in the exposed areas, and
      (c) at least one electron-donating spectral sensitizing compound capable of conferring sensitivity to said surfactant to radiation within the wavelength range 300 to 900 nm; and
Article II comprises:
   a support bearing on at least one surface thereof a positive-acting imageable member comprising in sequence, $R^{11}$ is a straight chain alkyl, alkenyl, alkynyl, alkylphenyl or perfluoroalkyl, -alkenyl, or -alkynyl group all having 7 to 30 carbon atoms; and
n is 1 or 2.
22. The process according to claim 20 wherein P is selected from
$CBr_3CH_2—$, $CCl_3CH_2—$,
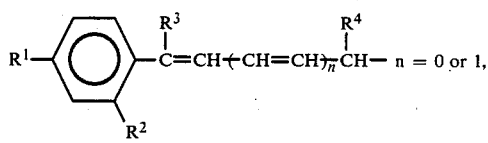 n = 0 or 1,
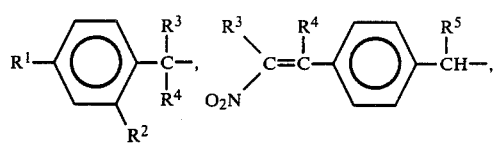
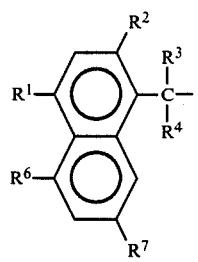
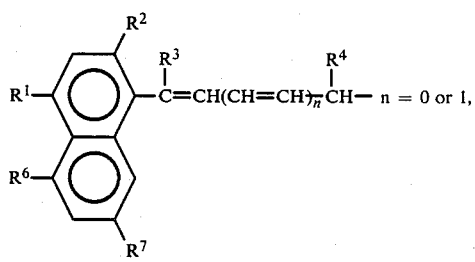 n = 0 or 1,
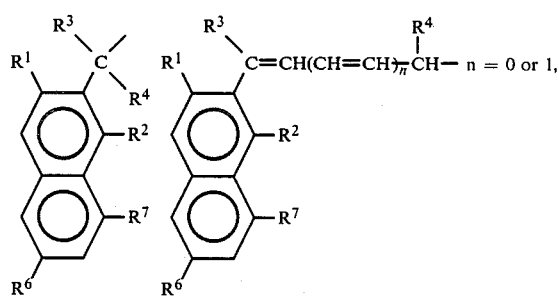 n = 0 or 1,
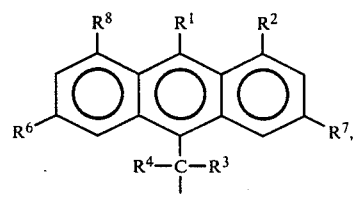
-continued
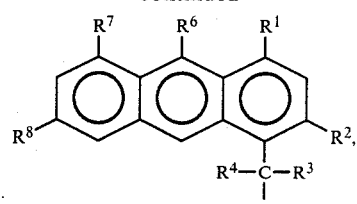
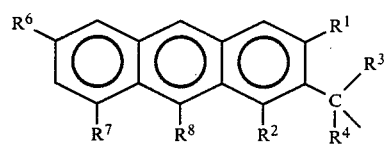
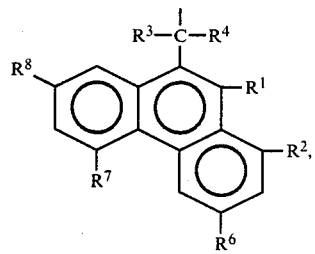
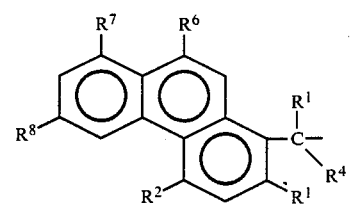
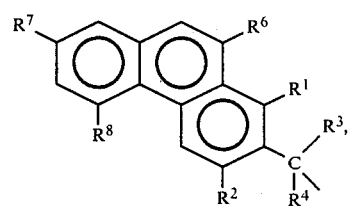
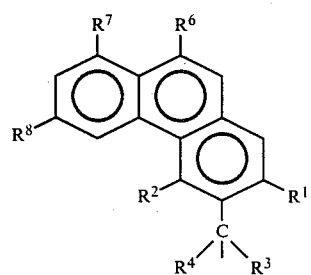
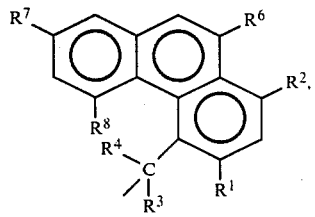

-continued

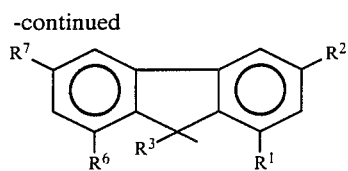

wherein
- $R^1$, $R^2$, $R^6$, $R^7$, $R^8$ are independently chosen from the group consisting of H, $NO_2$, CN and other radicals with Hammett Sigma constants greater then $+0.5$ providing that at least one of $R^1$, $R^2$, $R^6$, $R^7$ and $R^8$ is not H;
- $R^3$, $R^4$, $R^5$ are selected from the group consisting of H, alkyl of $C_1$ to $C_4$, alkenyl of $C_1$ to $C_4$, and phenyl, styryl, substituted phenyl, and substituted styryl.

23. The process of claim 16 wherein the degree of difference in peel strengths between (a) the frangible layer and the photosensitive layer and (b) the frangible layer and the support or the strippably adherent layer is at least 10 percent both in the unexposed article and the exposed article.

24. The process of claim 16 wherein said frangible layer comprises a metal, metal oxide, metal salts, or mixtures of metal and either metal oxide or metal salt.

25. The process of claim 16 wherein said frangible layer has a thickness of 5 to 500 nm and a peel strength from said support or said unexposed photosensitive layer of 0.8 to 40 g/cm.

26. The process of claim 16 wherein said imageable member further comprises a plasticizer present in said photosensitive layer in the range of 0.1 to 10 weight percent of the coating solution.

* * * * *

UNITED STATES PATENT AND TRADEMARK OFFICE
CERTIFICATE OF CORRECTION

PATENT NO. : 4,554,238

DATED : November 19, 1985

INVENTOR(S) : Stanley C. Busman

It is certified that error appears in the above-identified patent and that said Letters Patent is hereby corrected as shown below:

On the title page (first page) section [75] Inventor:

delete "Bushman" and insert --Busman--

Name of inventor should be Stanley C. Busman.

Signed and Sealed this

Second Day of September 1986

[SEAL]

Attest:

DONALD J. QUIGG

Attesting Officer

Commissioner of Patents and Trademarks